United States Patent
Pavier et al.

(10) Patent No.: US 8,143,729 B2
(45) Date of Patent: Mar. 27, 2012

(54) AUTOCLAVE CAPABLE CHIP-SCALE PACKAGE

(75) Inventors: Mark Pavier, West Sussex (GB); Danish Khatri, El Segundo, CA (US); Daniel Cutler, Surrey (GB); Andrew Neil Sawle, West Sussex (GB); Susan Johns, Cardiff (GB); Martin Carroll, Cardiff (GB); David Paul Jones, Newport (GB)

(73) Assignee: International Rectifier Corporation, El Segundo, CA (US)

( * ) Notice: Subject to any disclaimer, the term of this patent is extended or adjusted under 35 U.S.C. 154(b) by 182 days.

(21) Appl. No.: 12/359,735

(22) Filed: Jan. 26, 2009

(65) Prior Publication Data

US 2009/0218684 A1    Sep. 3, 2009

Related U.S. Application Data

(60) Provisional application No. 61/062,328, filed on Jan. 25, 2008.

(51) Int. Cl.
*H01L 23/48* (2006.01)
*H01L 23/29* (2006.01)

(52) U.S. Cl. ........ 257/778; 257/783; 257/790; 257/713; 257/E23.181; 257/E23.026

(58) Field of Classification Search .......... 257/778, 257/783, 713, 790, E23.181, E23.026
See application file for complete search history.

(56) References Cited

U.S. PATENT DOCUMENTS

| | | | |
|---|---|---|---|
| 5,047,833 A * | 9/1991 | Gould | 257/772 |
| 5,693,565 A * | 12/1997 | Camilletti et al. | 438/17 |
| 6,624,522 B2 * | 9/2003 | Standing et al. | 257/782 |
| 7,005,752 B2 * | 2/2006 | Bojkov et al. | 257/786 |
| 7,247,097 B2 * | 7/2007 | Woolston | 463/37 |
| 7,307,342 B2 * | 12/2007 | Jeong et al. | 257/750 |
| 7,408,251 B2 * | 8/2008 | Hata et al. | 257/678 |
| 7,586,180 B2 * | 9/2009 | Hata et al. | 257/678 |
| 2003/0080420 A1 * | 5/2003 | Ohara | 257/737 |
| 2003/0209713 A1 * | 11/2003 | Kimura et al. | 257/72 |
| 2005/0146030 A1 * | 7/2005 | Miyazaki | 257/738 |
| 2006/0060970 A1 * | 3/2006 | Jeong et al. | 257/750 |
| 2007/0052110 A1 * | 3/2007 | Lu | 257/782 |
| 2007/0257376 A1 * | 11/2007 | Shimokawa et al. | 257/778 |

* cited by examiner

*Primary Examiner* — Nitin Parekh
(74) *Attorney, Agent, or Firm* — Farjami & Farjami LLP

(57) ABSTRACT

A power semiconductor package that includes a power semiconductor device having a threshold voltage that does not vary when subjected to an autoclave test.

20 Claims, 6 Drawing Sheets

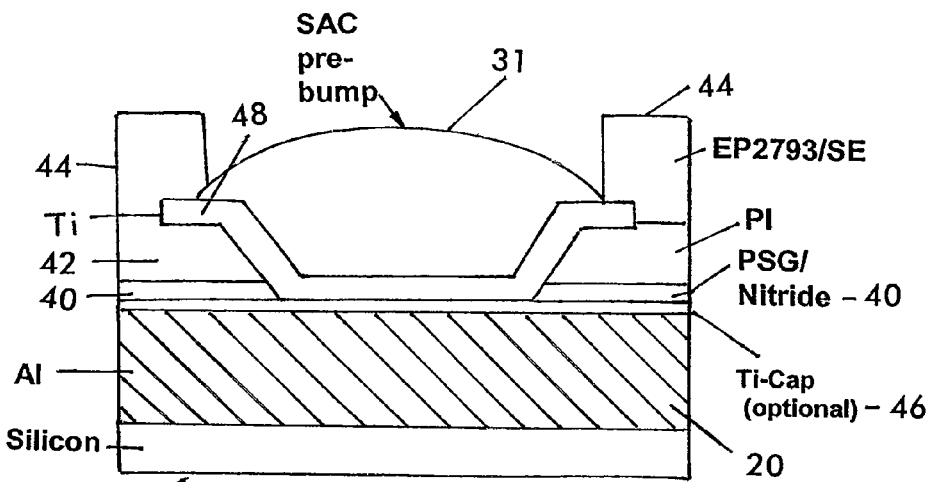
FIG. 3C
Image showing SE/EP passivation overlapping solderable front metal
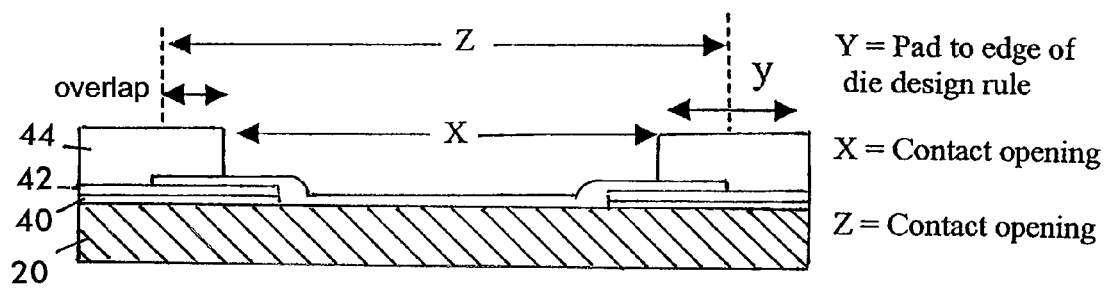
Design with epoxy ring structure  FIG. 4
Y = Pad to edge of die design rule
X = Contact opening
Z = Contact opening
Stress induced damage at corner of pads on die containing Nitride/Polyimide/SE/EP passivation
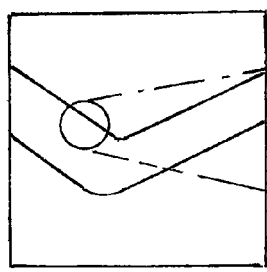
FIG. 5A
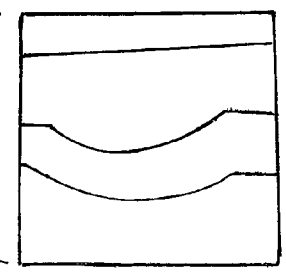
FIG. 5B

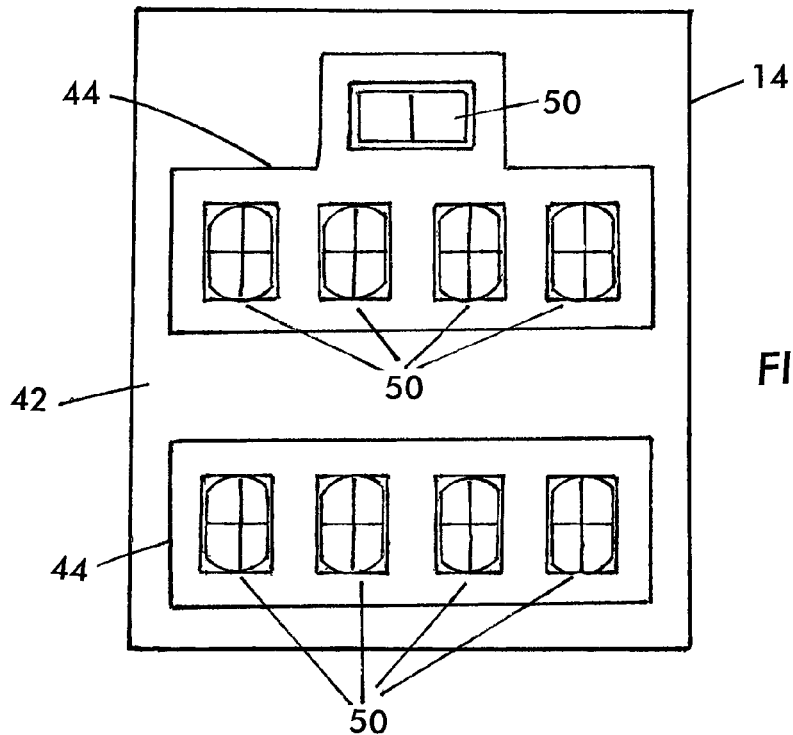

FIG. 6

| Design | 1 | 2 | 3 | 4 | 5 |
|---|---|---|---|---|---|
| Polyimide contact radius | 25um | 295um | 295um | 250um | 255um |
| Polyimide to SFM spacing | 80um | 80um | 80um | 80um | 120um |
| SFM radius | 70um | 375um | 70um | 70um | 70um |
| Purpose | Control group & gate pad | SFM to follow profile of solder joint. Ensure good coverage of solder around contact | SFM to PI contact opening in corners extended to increase path length for moisture | Same SFM outline as group 3 but with reduced PI contact radius | Increased SFM to PI contact opening spacing |

FIG. 7

Close up of solderable pad on die showing poor solder coverage in the corners of pad Profile of regions where solder coverage is 100um thick or more is elliptical Note the device has been removed from the circuit board by grinding off the board Close up of a die that has been separated from the circuit board Thin solder coverage

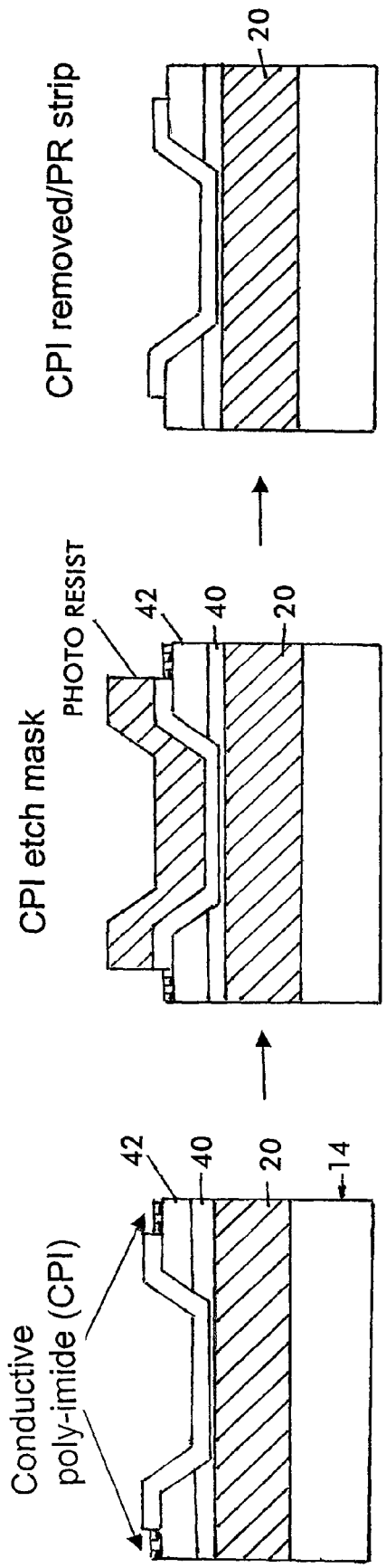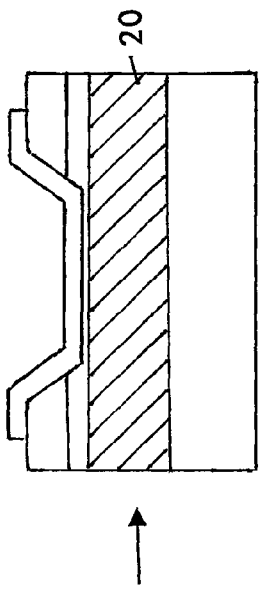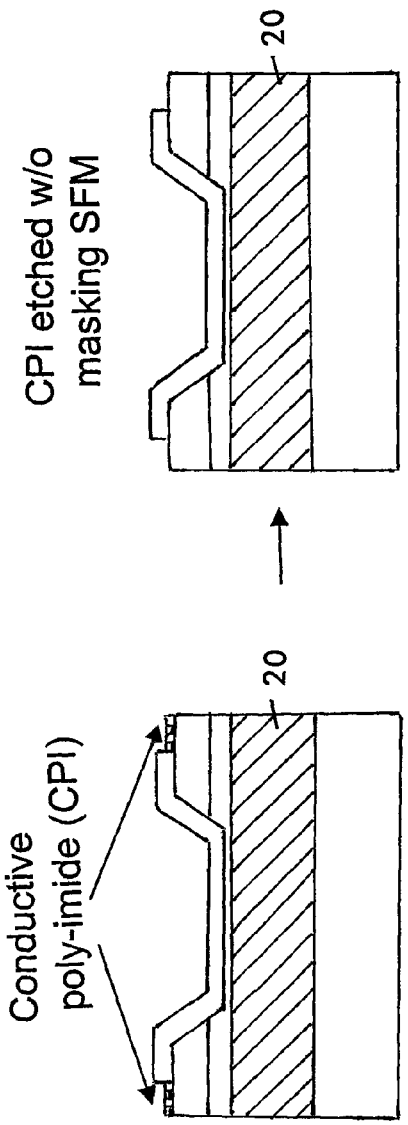

AUTOCLAVE CAPABLE CHIP-SCALE PACKAGE

RELATED APPLICATION

This application is based on and claims benefit of U.S. Provisional Application Ser. No. 61/062,328, filed on Jan. 25, 2008, entitled Autoclave Capable Chip-Scale Package, to which a claim of priority is hereby made and the disclosure of which is incorporated by reference.

FIELD OF INVENTION

The present application relates to a package containing a power semiconductor device that is capable of passing an autoclave standard test.

BACKGROUND

In order to pass the Q101 automotive quality specification a power semiconductor device must pass the autoclave test. The autoclave test involves simultaneously subjecting devices to at least 121° C. temperature, at least 100% relative humidity and at least 2 bars (15 PSIG) pressure for at least 96 hrs. The test is designed to evaluate the moisture resistance integrity of non-hermetic packages.

Referring to FIGS. 1A-1C, a package 10 according to the prior art includes a conductive can 12, and a power semiconductor die 14. Can 12 is typically formed with an electrically conductive material such as copper or a copper-based alloy, and may be coated with silver, gold or the like. Die 14 may be a vertical conduction type power semiconductor MOSFET having its drain electrode 16 electrically and mechanically attached to an interior surface of can 12 by a conductive adhesive 18 such as solder or a conductive epoxy (e.g. silver loaded epoxy). Source electrode 20, and gate electrode 22 of die 14 (which are disposed on a surface opposite to the drain electrode) each includes a solderable body which facilitates its direct connection to a respective conductive pad of a circuit board by a conductive adhesive (e.g. solder or conductive epoxy). Note that die 14 further includes passivation body 30 which partially covers source electrode 20 and gate electrode 22, but includes openings to allow access at least to the solderable portions thereof for electrical connection. Note that passivation body 30 may be comprised of a stack of two different passivation materials. In package 10, conductive can 12 includes web portion 13 (to which die 14 is electrically and mechanically connected), wall 15 surrounding web portion 13, and two oppositely disposed rails 32 extending from wall 15 each configured for connection to a respective conductive pad on a circuit board. Die 14 is spaced from wall 13 of can 12; i.e. wall 13 surrounds die 14.

In a package according to the prior art, source electrode 20, and gate electrode 22 may be soldered down by the user. Specifically, the user applies solder to, for example, the pads of a circuit board, and the electrodes of the die are attached to the pads by the solder so placed.

A package as described above is generally shown in U.S. Pat. No. 6,624,522 and also in U.S. patent application Ser. No. 11/378,607 the entire contents of which are incorporated by reference. Also, the assignee of the present application sells packages generally shown by FIGS. 1A-1C herein under the trademark DirectFET.

BRIEF DESCRIPTION OF THE FIGURES

FIG. 3C illustrates an enlarged portion (portion 3B in FIG. 3A) of a die in a package according to an alternative embodiment of the present invention.
FIG. 4 illustrates a portion of a die in a package according to the present invention.
FIGS. 5A-5B illustrate examples of damage to a die resulting from the application of the temperature cycle test.
FIG. 6 illustrates a passivation scheme according to one aspect of the present invention.
FIG. 7 illustrates a variety of designs evaluated for use in a preferred embodiment of the present invention.
FIGS. 9A-9E illustrate steps in the preparation of a die for a package according to the present invention.

DETAILED DESCRIPTION

Failure analysis of DirectFET packages that have been subjected to the autoclave test show that moisture is able to penetrate the passivation materials which results in increased levels of leakage within the package and corrosion of the semiconductor device metallization.

In order to pass the autoclave test it is important to understand the possible routes for moisture to ingress through the device structure. These routes are highlighted in FIG. 2 for the current DirectFET packages which shows a simplified cross section through the source electrode of the die 14 contained in the package.

Figure 2:
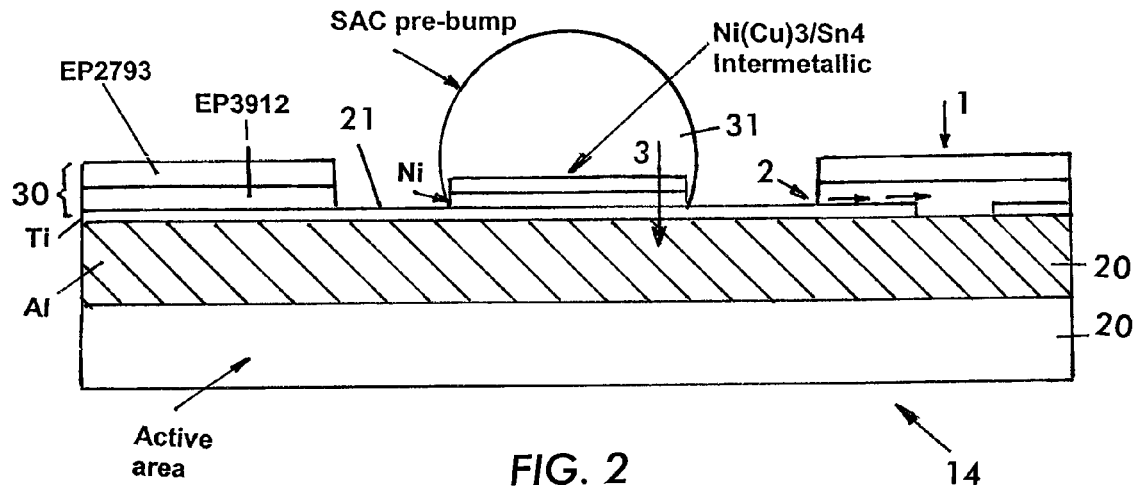
FIG. 2 illustrates a portion of a die used in a package according to the prior art.

Referring to FIG. 2, it is possible for moisture to enter the device through the bulk passivation 30 (Route 1), and the interface between top metallization (which includes source electrode 20 and a titanium cap layer 21) and bulk passivation 30 (Route 2). It may also be possible for moisture to enter through the interface between the solder bump 31 and underlying source electrode metallurgy (Ti cap 21 and source 20).

In order to reduce the moisture uptake through the bulk passivation material 30 several materials candidates have been evaluated by the inventors including epoxies (JSR/Electra), polyimides (Toray/Hitachi) and silicon epoxies (Electra). Polyimide materials showed the most promising results in autoclave tests and significantly reduced the number of device failures.

In order to reduce the moisture penetration along interfaces between passivation and the underlying metallurgy (Route 2) a new electrode contact arrangement was employed. The new structure contains an overlapping solderable front metal scheme (see FIG. 3B and related description below). The metal scheme contains a layer of 2 k/5.5 k/6 k Ti/Ni/Ag (k indicates Kilo Angstroms) which extends over contact opening in the passivation, covers the edge of the passivation stack and further extends partially over the top surface of the passivation.

Figure 1A:
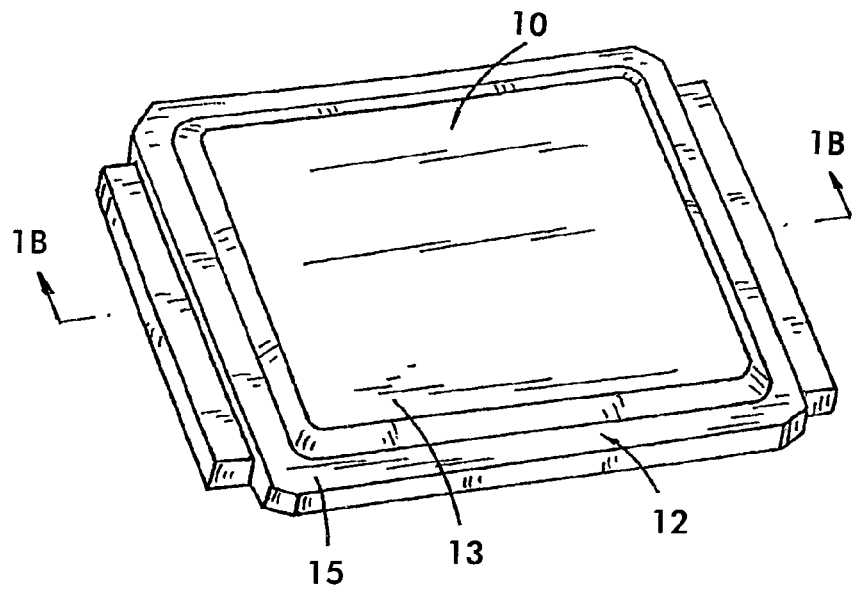
FIGS. 1A-1C illustrate a package according to the prior art.
Figure 1B:
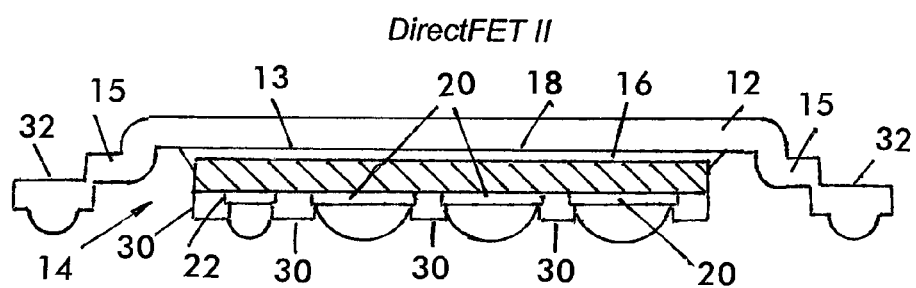
Figure 1C:
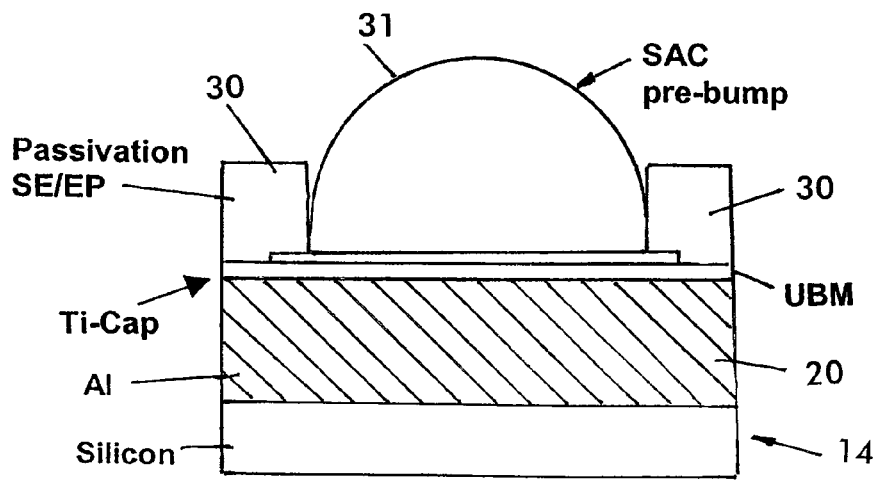
Figure 3A:
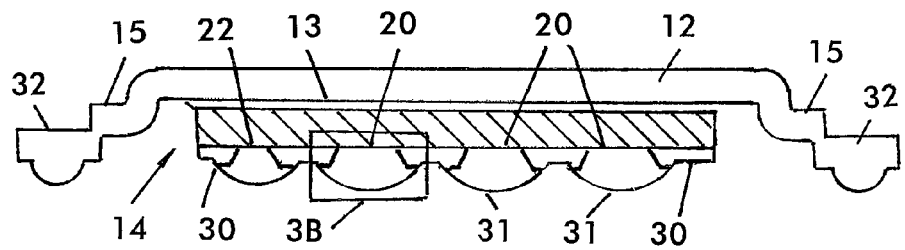
FIG. 3A illustrates a cross-sectional view of a package according to the present invention.
Figure 3B:
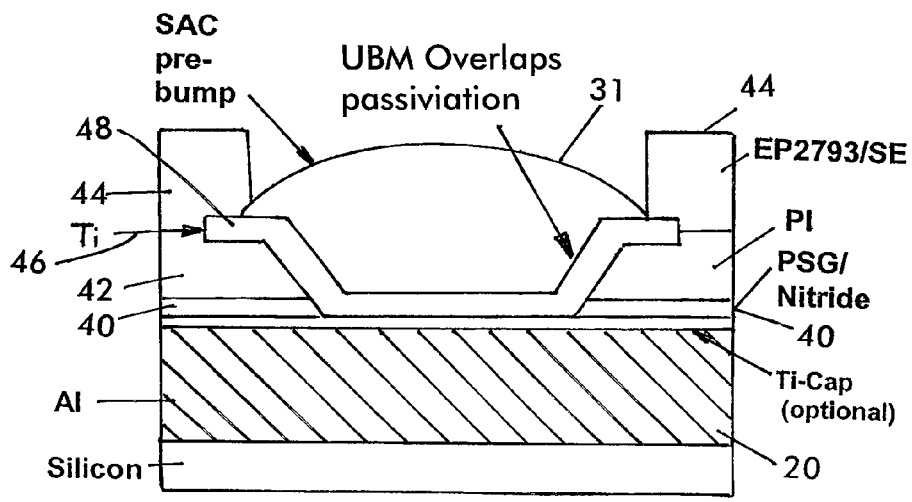
FIG. 3B illustrates an enlarged portion (portion 3B in FIG. 3A) of a die in a package according to the present invention.

Referring to FIGS. 3A-3B, in which like numerals identify like features, in a package according to the present invention, can 12 and the materials forming can 12 can be preferably the same as those used in DirectFET packages or similar packages (see FIGS. 1A-1C). Also, die 14 can be any die suitable for DirectFET or a similar package. According to the present invention, however, die 14 includes a novel contact arrangement. Specifically, as better illustrated by FIG. 3B, die 14 includes over at least source electrode 20 thereof a first passivation body 40 (which may be formed of a stack of PSG (phosphosilicate glass)/nitride (e.g. oxynitride), second passivation body 42 (which may be formed of polyimide) over first passivation body 40, and third passivation body 44 (which may be formed of a dual layer stack of a silicon epoxy and epoxy such as EP3912 and EP2793) over second passivation body 42. An opening extending through first and second passivation bodies 40, 42 allows access to the top surface of source electrode 20. According to an aspect of the present invention, an under bump metallization (UBM) is provided that extends from the bottom of opening in passivation bodies 40, 42 (i.e. the exposed surface of source electrode 20) along the sidewalls of the opening, over a portion of second passivation body 42 surrounding the opening, and under a portion of third passivation body 44 surrounding the opening in first and second passivation bodies 40, 42. The UBM in a die 14 according to the present invention includes a titanium layer 46 which is directly over source electrode 20, walls of the opening in passivations 40, 42, and over the top surface of second passivation body 42. UBM further includes a solderable body 48 formed over titanium layer 46. The solderable body 48 may be any suitable solderable body stack, and preferably includes a layer of Ni over titanium and a layer of silver over nickel. Note further that optionally die 14 may be pre-bumped with a solder bump 31 over solderable body 48. The solder bump may be preferably lead free. A suitable solder bump may be formed with tin silver copper (SnAgCu or SAC).

A die 14 in a package according to the present invention may include a plurality of arrangements such as the one shown by FIG. 3B over a source electrode thereof. Further, one or more arrangements similar to the one shown by FIG. 3B may be provided over gate electrode 22 of a die in a package according to the present invention. Note that passivation bodies 40, 42, 44 may form a continuous body over both the source electrode and the gate electrode of die 14, but include openings each for receiving a UBM as described above with reference to FIG. 3B.

The overlap scheme (FIG. 3B) was evaluated in conjunction with combinations of materials in the passivation stack. In particular, stacks containing 2 kA/8 KA PSG/Nitride 40, Polyimide 42, titanium capping layer and SE/EP epoxy passivation 44 were evaluated in autoclave, temperature cycling and high humidity high temperature bias (H3TRB) tests. The results showed that schemes containing the use of PSG/Nitride 40/Polyimide 42 and the SE (silicon epoxy)/EP (Electra polymer) 44 passivation stack repeatedly passed the autoclave test.

Cross sectioning of devices post autoclave and H3TRB testing showed that Ti in the regions where solderable body 48 overlaps the first and second passivation bodies 40, 42 can become oxidized reducing the mechanical strength of the contact. Application of the SE/EP passivation 44 over the solderable front metal edges (see FIG. 3B) has been shown to significantly reduce the damage to the Ti and improve the mechanical strength of the joint. FIG. 4 shows the overlap of the SE/EP passivation 44 over the solderable front metal.

While the materials containing PSG/Nitride 40/Polyimide 42 showed good performance in autoclave, results in temperature cycling were significantly worse, with high fallouts due to stress related damage at the edge of the die. In particular, second and third passivation bodies 42, 44 would lift off the die surface at the corners as shown in FIGS. 5A, 5B.

A modified design was chosen to remove the SE/EP stack (third passivation 44) from the corners reducing the stress on the die. FIG. 6 shows a typical layout for die containing 9 solderable pads 50. Note that while passivation 42 may extend up to the peripheral edges of the semiconductor die, passivation 44 is recessed back from the edges and particularly the corners of the die to reduce chances of the peeling thereof. This device was evaluated in temperature cycling and passed the test without any damage to the die or shifts in device parameters.

Several test vehicles containing the SFM overlap scheme (FIG. 3B) were evaluated in high temperature humidity and bias (H3TRB) tests. Devices that failed this test typically show a reduction in threshold voltage. Failure analysis localized the failures to originate in the corner regions of the contact openings in the polyimide (second passivation 42). Failures are typically corrosion related and caused by a combination of moisture and residual weak organic acid present within the solder flux. In order to improve the seal created by the solderable front metal overlap scheme (FIG. 3B) in the corner regions of the die, several designs with increased contact opening to solderable front metal edge spacing were evaluated. These are shown in FIG. 7.

Figure 8B:
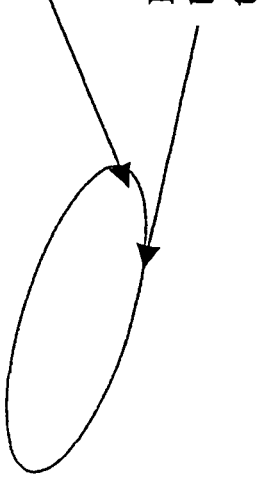
FIGS. 8A, 8B illustrate solder coverage on solderable pads of a die in a package according to the present invention.
Figure 8A:
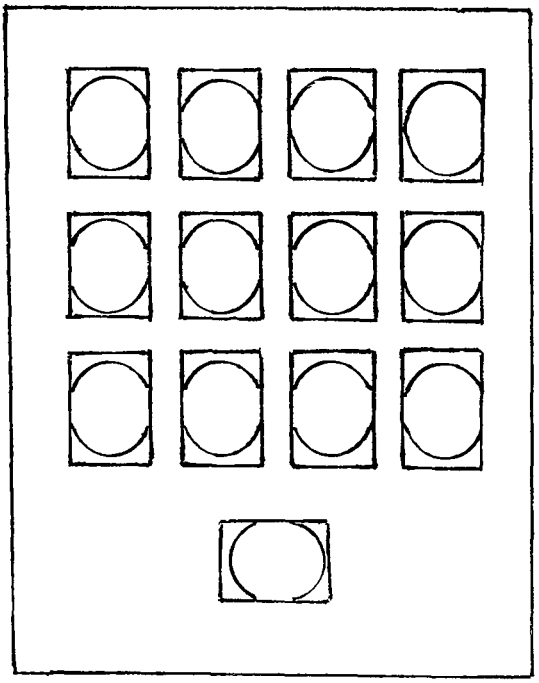

It should be noted that the designs shown in FIG. 7 were also influenced by the profile of the solder bump over the solderable contact. Cross sections through the solder bumps revealed that solder thickness was relatively thin over the corner regions of the solderable pads. Images illustrating thin solder coverage in the corners of pads are shown in FIGS. 8A and 8B. With reference to FIG. 8B it can be shown that the perimeter of the regions of the solderable contact with adequate solder coverage over the pad, e.g. where the solder is at least 100 µm in thickness, follow a profile that is similar to that of an ellipse. The radii of the contact designs in FIG. 7 were selected to closely match the radii of the elliptical solder profile.

After evaluating the options shown in FIG. 7 in H3TRB tests, options 4 and 5 passed the tests with no Vgsth shifting or failures. The contact design option 4 was selected for qualification. This option provided a good tradeoff between improving performance in H3TRB while maintaining a good electrical and thermal contact to the die surface.

In an alternative embodiment, it is possible to replace titanium layer 46 with a titanium cap over the entire aluminum front metal (source electrode 20 and gate electrode 22) of the die. Such a Titanium Cap would include a layer of titanium extending under the first passivation over preferably the entire surface of the source electrode and the entire surface of the gate electrode of the device. FIG. 3C illustrates this alternative. Fabricating wafers with Ti-cap requires additional process stages in the wafer fab. To establish what the benefits of this layer are to the new device structure, devices with and without Ti-cap were evaluated. Devices containing 2 kA Ti-cap, no ti-cap and double thickness Ti (4 KA) in the solderable front metal were compared in H3TRB testing. It was determined that the thickness of Ti is a significant parameter in passing the reliability test. A package according to the preferred embodiment uses a thickness of 4 kA Ti in the overlap scheme (FIG. 3B).

In summary the key Differences between a DirectFET and a package according to the present invention are:

1) Overlap scheme (FIG. 3B) to provide environmental seal;

2) Use of PSG/nitride/polyimide passivation stack (FIG. 3B);

3) Use of selective passivation (solder mask) deposition to improve reliability in temperature cycling.

A package according to the present invention advantageously passes Q101 automotive and industrial quality specifications with autoclave testing. This advantage is in addition to those of the DirectFET platforms (e.g. low parasitic impedance, low profile, light weight, low thermal resistance and inductance, can be dual sided cooled . . . ).

A process for fabrication of a die 14 for a package according to the present invention includes:

1) Forming first passivation 40 and second passivation 42;
2) forming an opening in passivation 40, 42 to expose source/gate electrode;
3) forming UBM inside the opening to obtain a structure such as shown in FIG. 9A;
4) covering UBM with photoresist (FIG. 9B) and remove residual metal from second passivation 42 (i.e. remove contaminated passivation referred to as conductive polyimide) followed by removal of photoresist (FIG. 9C); or remove conductive polyimide without applying photoresist first (FIGS. 9D and 9E).

The assembly process stages for a package according to the present invention include:

SE (Silicon Epoxy) Passivation Print
SE Passivation Dry
Passivation Print
Passivation Dry
Wafer Exposure
Passivation Developing
Passivation Curing
Solder Printing
Solder Reflow
Flux Cleaning
Auto Wafer Inspection
Wafer Mounting
Wafer Sawing
Visual Inspection
Die Bond
DB Epoxy Curing
Trim/Test/Inspection/Marking/T&R
Labeling and Packing
Ship to Warehouse It should be noted that although FIGS. 1A-1C, 3A, and 6 illustrate a die having nine solderable pads thereon, a die with fewer or more pads should be considered within the present invention.

Furthermore, although the preferred embodiment is a vertical conduction power MOSFET, the present invention is equally applicable to other devices, e.g., IGBTs, diodes and the like.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor package comprising:
a power semiconductor device that includes a semiconductor die and at least a first electrode on a first surface of said semiconductor die, said power semiconductor device having a threshold voltage; and
a connector arrangement that includes a solderable contact in electrical contact with said first electrode and a passivation arrangement disposed over said first electrode, said solderable contact and said passivation arrangement being configured so that said threshold voltage of said power semiconductor device does not vary when said power semiconductor device is subjected to an autoclave test;
wherein said passivation arrangement extends over a portion of said solderable contact and extends under said portion of said solderable contact; and
wherein a top portion of said passivation arrangement is recessed back from peripheral corners of said semiconductor die.

2. The power semiconductor package of claim 1, wherein said passivation arrangement includes a first passivation layer on said first electrode, a second passivation layer on said first passivation layer, and a third passivation layer on said second passivation layer.

3. The power semiconductor package of claim 2, wherein said semiconductor die includes peripheral edges that define the boundaries thereof, and wherein said third passivation layer is recessed back from said peripheral edges of said semiconductor die.

4. The power semiconductor package of claim 2, further comprising an opening that extends through said first and second passivation layers to said first electrode, wherein said solderable contact extends into said opening and said portion of said solderable contact overlaps a portion of said second passivation layer, and wherein said third passivation layer extends over said portion of said solderable contact and around said opening.

5. The power semiconductor package of claim 1, further comprising a titanium layer disposed directly over said first electrode under said solderable contact.

6. The power semiconductor package of claim 1, further comprising a titanium layer disposed directly over said first electrode and under said passivation arrangement.

7. The power semiconductor package of claim 1, further comprising a titanium layer disposed directly over said first electrode that is at least 4 kilo angstroms thick.

8. The power semiconductor package of claim 2, wherein said first passivation layer is comprised of PSG/Nitride, and said second passivation layer is comprised of Polyimide, and said third passivation layer is comprised of an epoxy stack that includes a first layer of silicon containing epoxy underneath a second layer of epoxy.

9. The power semiconductor package of claim 1, wherein said passivation arrangement includes a layer of polyimide.

10. The power semiconductor package of claim 1, wherein said power semiconductor device includes a second electrode on a second surface of said semiconductor die, said surface being opposite said first surface, and further comprising a conductive clip electrically and mechanically coupled to said second electrode.

11. The power semiconductor package of claim 10, wherein said conductive clip is cup-shaped.

12. A power semiconductor package comprising:
at least a first electrode disposed on a first surface of a semiconductor die;
a first passivation body disposed over at least said first electrode, a second passivation body over said first passivation body and a third passivation body over said second passivation body, an opening in said first and second passivation bodies;
an under bump metallization (UBM) electrically contacting said first electrode though said opening and extending over a portion of said second passivation body surrounding said opening and under a portion of said third passivation body surrounding said opening.

13. The power semiconductor package of claim 12, wherein said semiconductor die includes peripheral edges that define the boundaries thereof, and wherein said third passivation layer is recessed back from said peripheral edges of said semiconductor die.

14. The power semiconductor package of claim 12, further comprising a titanium layer disposed directly over said first electrode and under said UBM.

15. The power semiconductor package of claim 12, further comprising a titanium layer disposed directly over said first electrode and under said first, second and third passivation layers.

16. The power semiconductor package of claim 12, further comprising a titanium layer disposed directly over said first electrode, said titanium layer being at least 4 kilo angstroms thick.

17. The power semiconductor package of claim 12, wherein said first passivation layer is comprised of PSG/Nitride, said second passivation layer is comprised of Polyimide and said third passivation layer is comprised of an epoxy stack that includes a first layer of silicon containing epoxy underneath a second layer of epoxy.

18. The power semiconductor package of claim 12, further comprising a conductive can that is electrically and mechanically connected to said semiconductor die.

19. The power semiconductor package of claim 12, further comprising a gate electrode disposed on said first surface of said semiconductor die.

20. The power semiconductor package of claim 12, wherein said UBM comprises a solderable body including a layer of silver over a layer of nickel over a layer of titanium.

* * * * *